(12) United States Patent
Law et al.

(10) Patent No.: US 7,558,143 B1
(45) Date of Patent: *Jul. 7, 2009

(54) PROGRAMMABLE LOGIC DEVICE WITH POWER-SAVING ARCHITECTURE

(75) Inventors: Henry Law, Los Altos, CA (US); Brad Sharpe-Geisler, San Jose, CA (US); Giap Tran, San Jose, CA (US); Kiet Truong, San Jose, CA (US); Bai Nguyen, Union City, CA (US)

(73) Assignee: Lattice Semiconductor Corporation, Hillsboro, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 12/100,859

(22) Filed: Apr. 10, 2008

Related U.S. Application Data

(63) Continuation of application No. 11/235,616, filed on Sep. 26, 2005, now Pat. No. 7,376,037.

(51) Int. Cl.
*G11C 5/14* (2006.01)

(52) U.S. Cl. .................. 365/228; 365/227; 365/189.05
(58) Field of Classification Search ................ 365/228, 365/227, 189.05, 207
See application file for complete search history.

(56) References Cited

U.S. PATENT DOCUMENTS 5,845,139 A * 12/1998 Fischer et al. ............... 713/324
7,376,037 B1 * 5/2008 Law et al. .................... 365/226

* cited by examiner

*Primary Examiner*—Son Dinh

(57) ABSTRACT

A programmable logic device (PLD) such as a field programmable gate array (FPGA) has a power-down mode of operation that reduces power consumption during standby or idle periods for the PLD. In one embodiment, the PLD includes a switch such as an internal power supply operable to provide power to the logic core of the PLD, such as the programmable logic blocks, routing structure, and volatile configuration memory. The internal power supply powers down the logic core in response to assertion of a power-down signal, while power is maintained to other circuitry of the PLD.

20 Claims, 5 Drawing Sheets

PROGRAMMABLE LOGIC DEVICE WITH POWER-SAVING ARCHITECTURE

RELATED APPLICATION DATA

This application is a continuation of U.S. application Ser. No. 11/235,616, filed Sep. 26, 2005, which is hereby incorporated herein by reference in its entirety.

TECHNICAL FIELD

The present invention relates generally to programmable logic devices and, more particularly, to a programmable logic device adapted for reduced power consumption.

BACKGROUND

Programmable logic devices such as field programmable gate arrays (FPGAs) allow a designer to avoid the expense of constructing an ASIC to implement a desired function. Rather than design an ASIC, a user may configure an off-the-shelf programmable logic device such as an FPGA to implement the desired function. However, as compared to the ASIC it replaces, an FPGA is a much more complex device because the FPGA must include the circuitry necessary to make it configurable. This additional circuitry is made up of active devices and interconnects. The active devices in particular will have a certain amount of leakage current that will not be present in a corresponding ASIC. Thus, an FPGA implementing a given function will have higher static power consumption than an equivalent ASIC implementing the same function.

The architecture of a typical FPGA may be better understood with reference to FIG. 1. In FIG. 1, an FPGA 100 includes a core 105 having an array of programmable logic blocks 110 (also referred to in the art as programmable logic cells, configurable logic blocks, programmable logic elements, or programmable logic regions). Each logic block 110 includes one or more look-up tables (LUTs) (not illustrated) that are configured by a user to implement a desired logical function. In addition, each logic block 110 will typically include one or more registers and often some additional logic circuitry which facilitates more compact implementations of commonly used functions such as ripple-carry. Core 105 also includes a routing structure 120 that couples signals to and from logic blocks 110. Because each logic block 110 can typically implement just a few logic gates, a logical function that a user desires to implement will often require the configuration of a fairly large number of logic blocks 110. Routing structure 120 must be quite complex to allow the necessary routing of signals from one logic block 110 to another across this fairly large number of logic blocks 110. Numerous junctions in routing structure 120 are configured with multiplexers or other switching structures and drivers to allow one conductor in routing structure 120 to couple to another conductor as desired. As a result, the core 105 consisting of the configurable routing structure 120 and the logic blocks 110 consumes a substantial amount of power, even when the FPGA 100 is idle, although considerably more can be consumed when switching. It will be appreciated, however, that static power consumption (of the core) becomes more appreciable as transistor dimensions are pushed into the deep submicron region. As transistor dimensions shrink, the operating voltages must be reduced with the net effect that leakage current increases, thereby causing static power consumption increases.

Should an FPGA be powered from a line power supply, this idle power consumption may be relatively inexpensive to supply. However, in a handheld or mobile application, a conventional FPGA will demand too much power during idle periods, limiting battery charge run time to unacceptably short periods. Thus, various power-saving measures have been adopted. For example, a "brute force" approach involves turning off all the external power supplies to an FPGA while the FPGA is in a standby state. If the FPGA does not have a non-volatile configuration memory, all configuration information will be lost as a result of such power shutoffs, thereby requiring reconfiguration of the device from an external serial E-PROM or FLASH device. Such a reconfiguration typically takes 100 ms or longer, which may be an unacceptable delay.

Accordingly, there is a need in the art for improved power-saving programmable logic device architectures.

SUMMARY

In accordance with one embodiment of the invention a programmable logic device includes volatile configuration memory operable to store configuration data for configuring the programmable logic device; a switch responsive to a power-down signal and operable to supply power to the volatile configuration memory if a power-down signal is de-asserted and to not supply power to the volatile configuration memory if the power-down signal is asserted; and non-volatile configuration memory operable to store configuration data for the volatile configuration memory and to transfer the configuration data to the volatile configuration memory after an asserted power-down signal is de-asserted.

In accordance with another embodiment of the invention, a programmable logic device, comprises a logic core; a power-down input pad operable to receive a power-down signal, the power-down signal having an asserted state and a de-asserted state; a switch responsive to a power-down signal and operable to supply power to the logic core if a power-down signal is de-asserted and to not supply power to the logic core if the power-down signal is asserted; and an input buffer coupled between the power-down input pad and the switch for buffering the power-down signal, the input buffer operable to receive power from an external power supply regardless of the state of the power-down signal.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

The present invention provides a programmable logic device adapted to enable substantial reduction in power consumption during standby periods in which the programmable logic device is idle and not actively performing logic operations. In the following discussion, this innovation will be described with respect to a field programmable gate array (FPGA). However, it will be appreciated that other types of programmable logic devices such as complex programmable logic devices (CPLDs) also benefit from this power supply topology.

As discussed herein, the presence of idle periods during operation of a configured FPGA may be exploited to conserve energy. For example, a handheld, battery-powered device such as a cell phone may include an FPGA configured to perform as a microprocessor such that a user of the device may prepare emails or other documents. Should such a device be powered up but idle for a length of time, the battery power will be rapidly drained if the configured FPGA is not powered down in some fashion.

Figure 2:
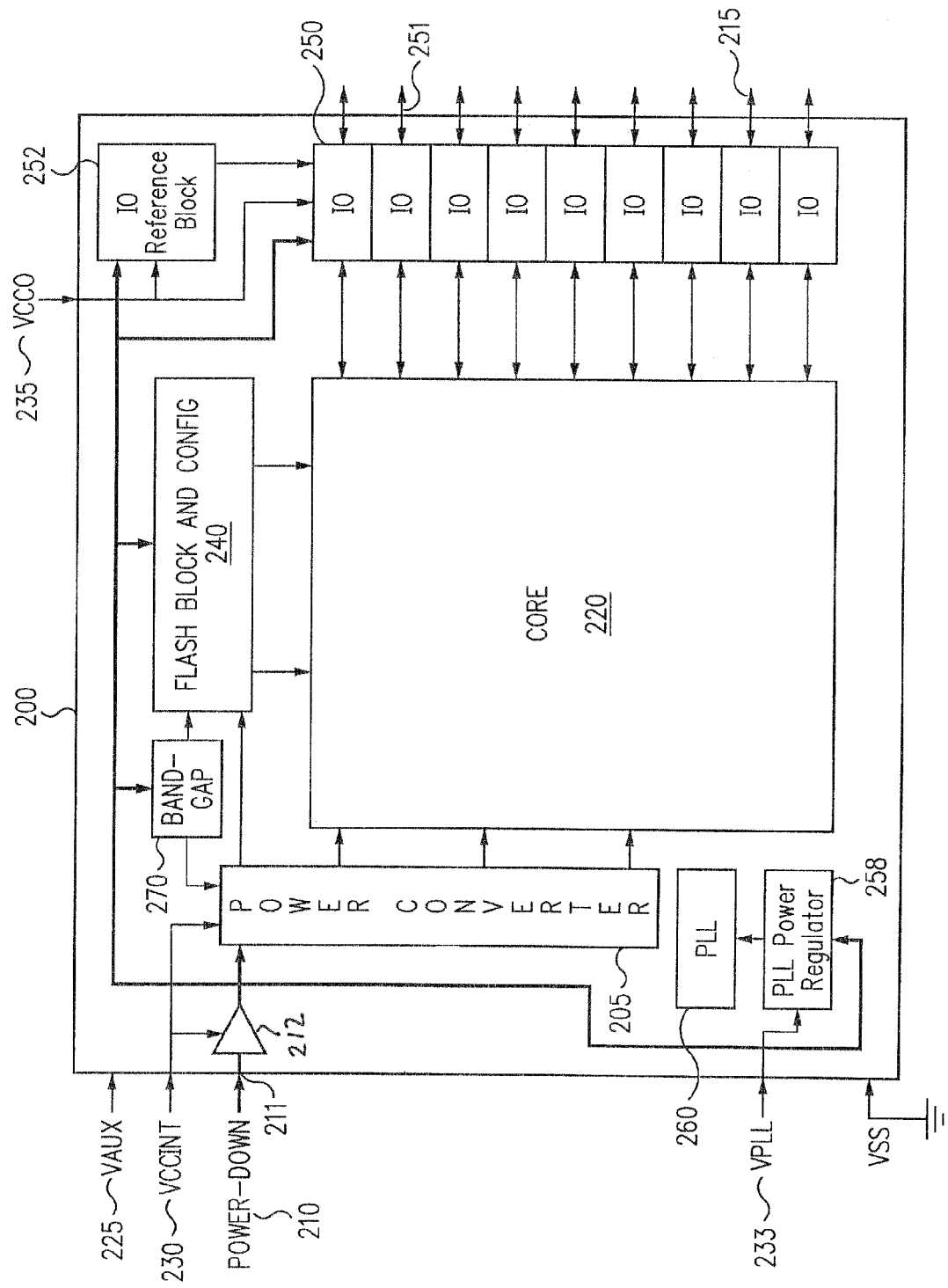
FIG. 2 is a block diagram of a programmable logic device configured with a power-saving architecture in accordance with an embodiment of the invention.

Turning now to FIG. 2, an FPGA 200 is illustrated that incorporates power-saving features that significantly reduce power consumption during such idle periods. FPGA 200 includes a switch such as an internal power supply 205 that powers down a logic core 220 in response to a power-down signal 210 being asserted. Power-down signal 210 may be asserted by an external controller (not illustrated) that monitors whether programmable logic device 200 is idle. For example, a decision to assert power-down signal 210 may be made should input/output signals 215 have remained unchanged for a given period of time. Alternatively, a decision to assert power-down signal 210 may be based on external signals or conditions to FPGA 200.

Figure 1:
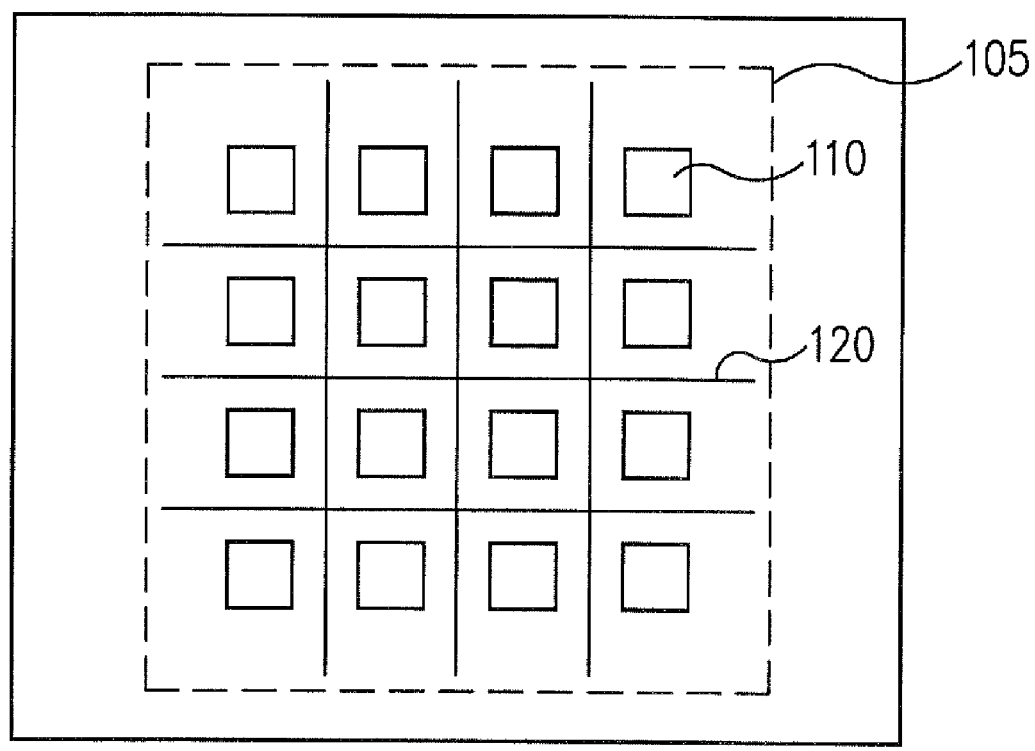
FIG. 1 is a block diagram of a conventional programmable logic device.

Internal power supply 205 provides power to logic core 220 if power-down signal 210 is not asserted. Core 220 includes logic blocks such as logic blocks 110 and associated routing structure 120 as discussed with regard to FIG. 1. In addition, core 220 may include the volatile configuration memory cells such as SRAM cells for the configuration of the logic blocks and the routing structure. Because core 220 is powered by internal power supply 205, core 220 will be non-operational while internal power supply 205 is shut down. This period of inactivity may be denoted as a "sleep mode" in contrast to normal operation during which internal power supply 205 supplies power to core 220. Although internal power supply 205 shuts down in response to the assertion of power-down signal 210, other power supplies are left operational. For example, an auxiliary power supply voltage VAUX 225, an external power supply voltage VCCINT 230, a PLL power supply voltage VPLL 233, and an input/output power supply voltage VCCO 235 may all remain operational after core 220 is powered dowel. Because these power supply voltages are not brought down, no power sequencing and associated delays are necessary if core 220 is powered back up in response to a de-assertion of power-down signal 210.

The decision of whether to assert power-down signal 210 may depend upon whether FPGA 200 includes a non-volatile memory for storing configuration data. For example, should FPGA 200 not include a non-volatile configuration memory, a considerable delay will occur at the transition from sleep mode to normal operation because of the necessary download time required to reconfigure the configuration memory cells in core 220 from an external configuration data source. Because the configuration data source is external, the configuration data may be downloaded through I/O cells 250 and associated pins or pads 251. There are thus physical constraints to the number of configuration data bits (such as just one to two bytes) that may be downloaded in parallel from an external source. Consequently, it is conventional to require as much as 100 milliseconds or more to configure a programmable logic device from an external source. However, an internal non-volatile configuration memory such as a FLASH memory 240 does not couple to the volatile configuration memory cells in core 220 through I/O cells 250. Thus, a relatively large number of configuration memory bits (such as hundreds of bits) may be ported from FLASH 240 to configuration memory cells within core 220 in parallel.

Programmable logic device 200 may thus re-configure core 220 from FLASH 240 in a relatively brief period such as one millisecond or less. In this fashion, programmable logic device 200 may be virtually "instant on" from a complete power-down of core 220. Thus, the decision to assert power-down signal 210 may be made much more frequently in such a non-volatile embodiment. For example, power-down signal 210 may be asserted after just one second or less of inactivity for core 220. In contrast, should programmable logic device 200 not include a non-volatile configuration memory such as FLASH 240, the decision to power down core 220 would have to be more judicious given the considerable delay incurred in reconfiguring core 220 from an external configuration data source.

Because the various power supply voltages such as VAUX 225, VCCINT 230, VPLL 233, and VCCO 235 remain on during the sleep mode, power could be consumed by corresponding circuitry within programmable logic device 200 that is powered by these voltages. Thus, in response to the assertion of power-down signal 210, a PLL power regulator 258 providing power to a PLL 260 through regulation of VPLL voltage 233 may also be powered down in the same manner as internal power supply 205. Moreover, because I/O cells 250 continue to receive VCCO voltage 235 during the sleep mode, associated pads 251 are tri-stated. Thus, despite VCCO voltage 235 being maintained during the sleep mode, very little power is lost. In addition, level translators (discussed further with regard to FIG. 4) within I/O cells 250 are forced into a known state. I/O reference circuits such as an I/O bus-keeper reference 252 are also made non-operational during the sleep mode so that pads 251 float. Thus, associated input buffers for these floating inputs are isolated during the sleep mode. It will be appreciated, however, that an input buffer 212 for a pad 211 receiving power-down signal 210 should remain operational so long as its external supply voltage such as VCCINT 230 remains powered. In this fashion, programmable logic device 200 may respond to the de-assertion of power-down signal 210, thereby ending the sleep mode and resuming normal operation.

Additional components that may be powered down during sleep mode include a band gap reference 270 that provides a reference voltage to internal power supply 205, should internal power supply 205 require such a reference. Because internal power supply 205 is not operating during sleep mode, maintaining operation of band gap reference 270 during this time would consume unnecessary power. In addition, the associated logic and charge pumps (not illustrated) for FLASH 240 may also be made non-operational in response to the assertion of power-down signal 210. Should core 220 include any embedded memories, any internal information stored in these memories would be lost in response to the assertion of power-down signal 210 because these embedded memories would also be powered down. In this fashion, the power consumed by programmable logic device 200 during the sleep mode is a negligible amount such as a few microamps.

Figure 3:
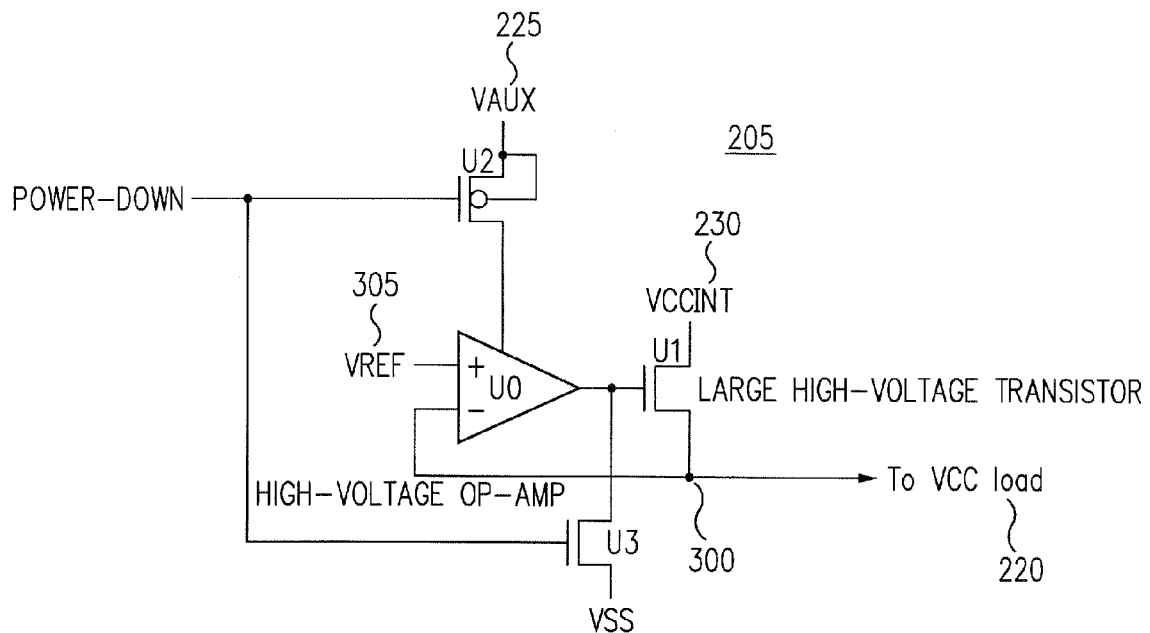
FIG. 3 is a circuit diagram of an exemplary internal power supply in accordance with an embodiment of the invention.

An exemplary circuit diagram for internal power supply 205 is illustrated in FIG. 3. Core 220 receives its operating current from a source of a relatively large high voltage NMOS transistor U1 in a source-follower configuration. A high voltage differential amplifier U0 controls the gate of transistor U1 in response to comparing an internal VCC voltage provided to core 220 at a node 300 to a reference voltage VREF 305 from band gap reference 270 (of FIG. 2). In this fashion, the internal VCC voltage is a regulated version of an external power supply voltage such as VCCINT 230 supplied to the drain of U1. Differential amplifier U0 is powered by an external power supply voltage such as VAUX 225 as received through a PMOS transistor U2 whose gate is controlled by power-down signal 220. To bring internal power supply 205 down, power-down signal 220 is asserted (active high), thereby causing PMOS transistor U2 to be non-conductive so that power is not supplied to differential amplifier U0. In addition, the assertion of power-down signal 220 causes an NMOS transistor U3 to be conductive, thereby pulling the gate of transistor U1 to ground so that no current flows to core 220 through transistor U1. It will be thus be appreciated that internal power supply 205 functions as a switch such that in its "OFF" position (corresponding to power-down signal 210 being asserted), the power supply voltage VCC to core 205 is grounded. Conversely, if internal power supply is in its "ON" position (corresponding to power-down signal 210 not being asserted), the power supply voltage VCC powers core 205.

Figure 4:
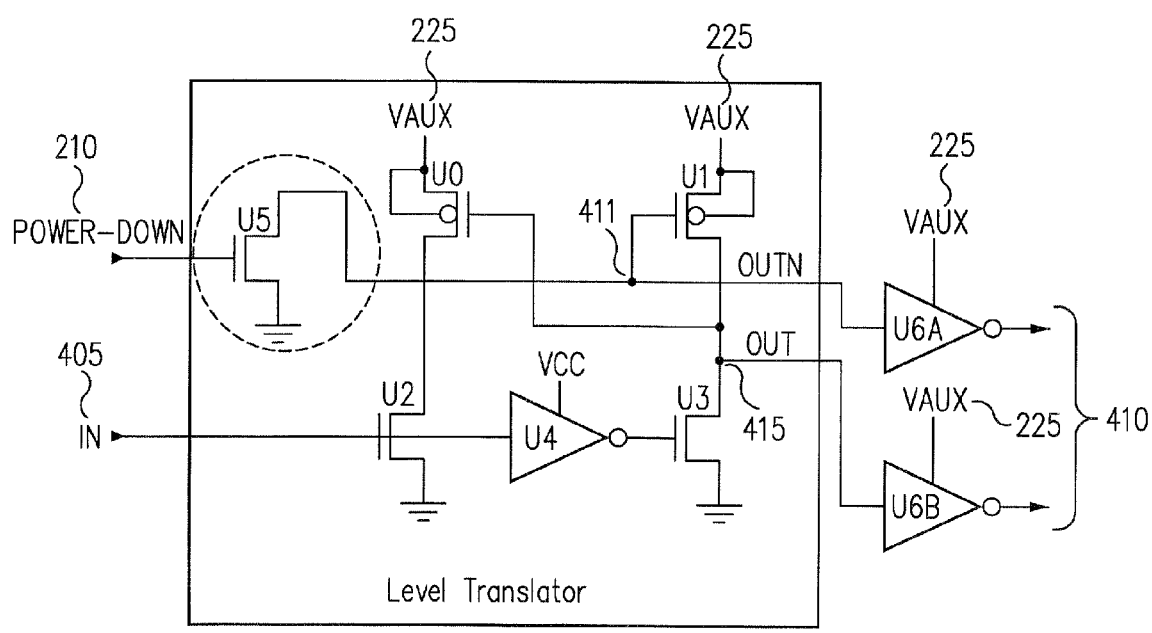
FIG. 4 is a circuit diagram of an exemplary level translator circuit in accordance with an embodiment of the invention.

As discussed above, each I/O circuit 250 not associated with power-down pad 211 may have its level translator circuit forced into a known state during sleep mode. An exemplary level translator circuit 400 is illustrated in FIG. 4. As known in the art, translator circuit 400 functions to translate an input voltage signal on input lead 405 into complementary output signals 410 having a different voltage protocol such as determined by external power supply voltage VAUX 225. An NMOS transistor U5 receives power-down signal 210 at its gate. Thus, when power-down signal 210 is asserted, transistor U5 is conductive, thereby grounding output node OUTN 411. The voltage on output node OUTN 4114 is also received at the gate of a PMOS transistor U1, thereby making transistor U1 conductive. Because the drain of transistor U1 connects to an output node OUT 415, this node will be brought high in response to the assertion of power-down signal 210. A PMOS transistor U0 has its gate connect to output node OUT 415 so that transistor U0 will not be conductive in response to the assertion of power-down signal 210. Thus, although output node OUTN 411 connects to the drain of transistor U0, this node wilt remain grounded while power-down signal 210 is asserted. Similarly, an inverting buffer U4 controls a gate of an NMOS transistor U3 responsive to a voltage on an input lead 405. The drain of transistor U3 connects to output node OUT 415. However, all transistor U3 can do is ground output node OUT 415, which is grounded regardless of whether transistor U3 is conductive or not. Thus, nodes OUT and OUTN will be in known, complementary states in response to the assertion of power-down signal 210. In turn, these known, complementary states prevent any "crossbar" currents from flowing in output inverters U6A and U6B, thereby conserving power during the sleep mode.

Figure 5:
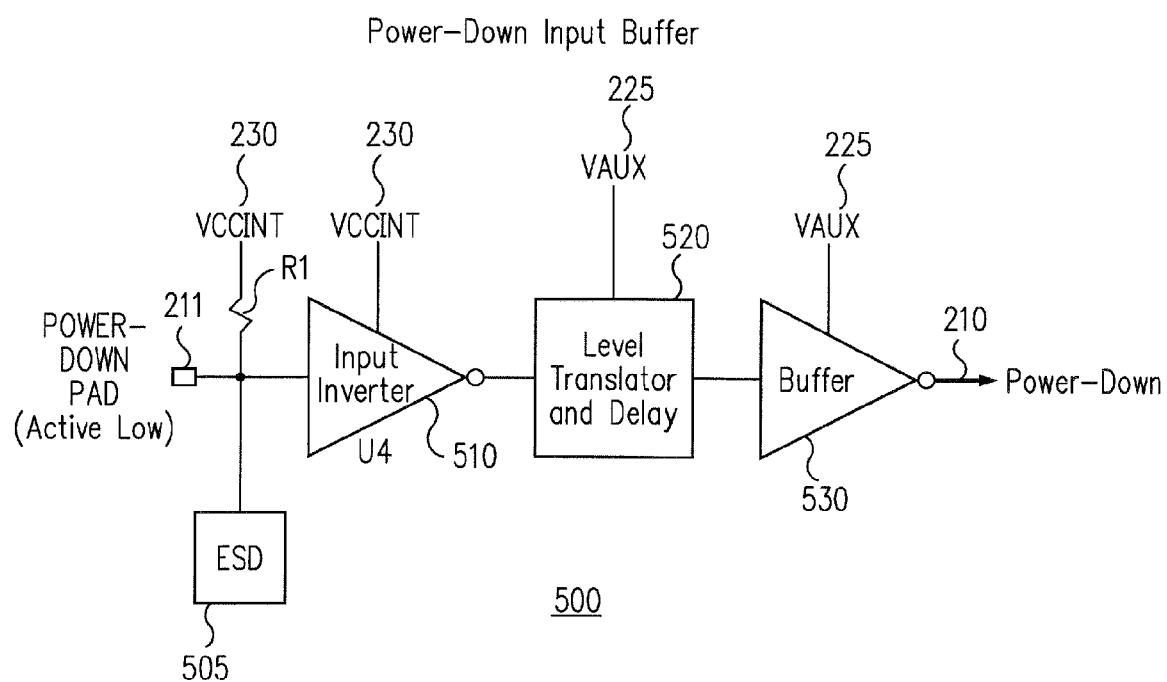
FIG. 5 is a circuit diagram of an I/O circuit for a power-down pad in accordance with an embodiment of the invention.

Turning now to FIG. 5, an exemplary I/O circuit 500 associated with power-down pad 211 is illustrated. To assure normal operation if pad 211 floats, a weak pull-up resistor R1 couples pad 211 to an external power supply voltage such as VCCINT 230. In addition, an electrostatic discharge (ESD) protection circuit 505 also couples to pad 211. External to programmable logic device 200, power-down signal 210 may be an active low signal. To provide an active high state for power-down signal 210 internally to programmable logic device 200, an inverter 510 couples to input pad 211 and provides an output to a level translator and delay circuit 520. In addition to translating power-down signal 210 to a voltage signaling protocol such as governed by external power supply voltage VAUX 225, level translator and delay circuit 500 introduces sufficient delay (such as 100 to 200 nanoseconds) so as to prevent glitches. After buffering through input buffer 530, power-down signal 210 may be sent to the rest of programmable logic device 200.

Figure 6:
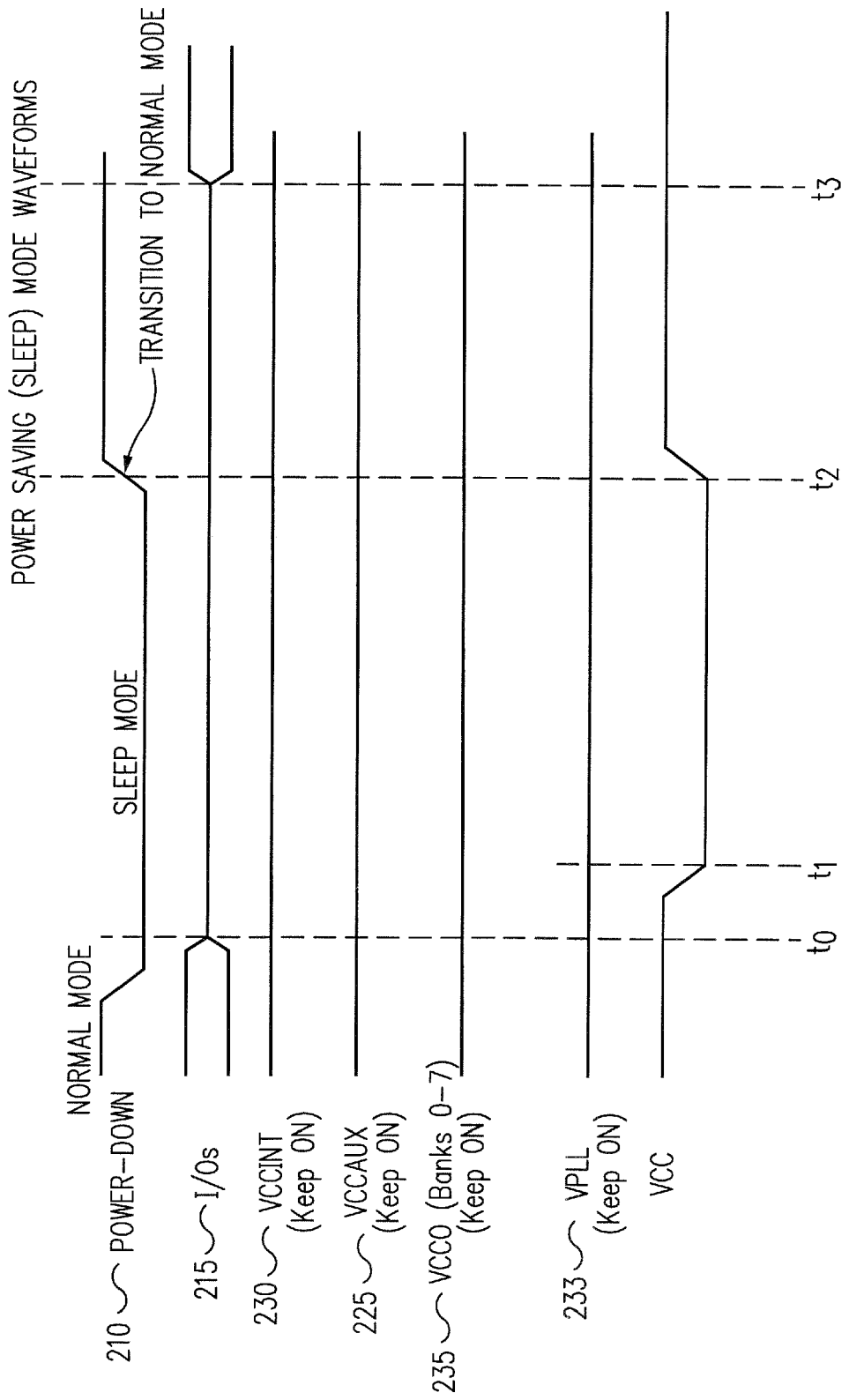
FIG. 6 is a timing diagram for a variety of signals for the programmable logic device of FIG. 2.

The operation of programmable logic device 200 may be better understood with respect to the timing diagram of FIG. 6, which illustrates the timing relationship for various signals during normal operation and sleep mode operation. Prior to time $t_0$, the programmable logic device is in normal operation. However, power-down signal 210 is activated at to so that the programmable logic device begins the transition to the sleep mode, whereupon I/O signals 215 are tri-stated. The power supply voltage VCC to core 220 (FIG. 2) may then be grounded at time $t_1$. However, all the externally-provided power supply voltages such as VCCINT 230, VCCAUX 225, VCCO 235, and VPLL 233 may stay powered regardless of whether the device is in sleep or normal operation. After time $t_1$, sleep mode may continue for as long as the user requires no activity from core 220. When activity is required from core 220, the power-down signal may be de-asserted at time $t_2$, whereupon VCC to core 205 may be restored. The configuration memory cells for core 220 must then be re-configured with the appropriate configuration data. Thus, configuration data may be ported from FLASH 240 (FIG. 2) into these cells. Advantageously, because FLASH 240 is integrated into programmable logic device 200, the necessary download time is relatively short, such as 1 to 2 milliseconds. At time $t_3$, the download is complete, whereupon the tri-state on I/O signals 215 may be released.

The power-saving architecture described and shown herein may be implemented in numerous alternative embodiments. For example, although described with regard to a programmable logic device including a non-volatile configuration memory, embodiments of the disclosed power-saving architecture may be implemented in programmable logic devices having only volatile configuration memories. Moreover, internal power supply 205 may be replaced by an external power supply and a switch that couples power from the external power supply to core 205. It will thus be apparent to those skilled in the art that various changes and modifications may be made to what has been disclosed without departing from this invention. The appended claims encompass all such changes and modifications as fall within the true spirit and scope of this invention.

We claim:
1. A programmable logic device, comprising:
volatile configuration memory operable to store configuration data for configuring the programmable logic device;
a switch responsive to a power-down signal and operable to supply power to the volatile configuration memory if a power-down signal is de-asserted and to not supply power to the volatile configuration memory if the power-down signal is asserted; and non-volatile configuration memory operable to store configuration data for the volatile configuration memory and to transfer the configuration data to the volatile configuration memory after an asserted power-down signal is de-asserted.

2. The programmable logic device of claim 1 wherein the switch comprises an internal power supply.

3. The programmable logic device of claim 2 including a band gap reference operable to provide a band gap reference voltage to the internal power supply, wherein the band gap reference is further operable to cease operation in response to assertion of the power-down signal.

4. The programmable logic device of claim 2 wherein the internal power supply includes a first transistor in a source-follower configuration operable to control a current drawn by a plurality of programmable logic blocks that include the volatile configuration memory.

5. The programmable logic device of claim 4 wherein the internal power supply includes a differential amplifier controlling a gate voltage of the first transistor in response to comparing a source voltage to a reference voltage, the internal power supply receiving power conducted by a second transistor operable to be non-conductive in response to assertion of the power-down signal.

6. The programmable logic device of claim 5 wherein the internal power supply further includes a third transistor operable to ground the gate voltage of the first transistor in response to assertion of the power-down signal.

7. The programmable logic device of claim 1 including other circuitry of the device operable to receive power from at least one external power supply regardless of the state of the power-down signal.

8. The programmable logic device of claim 1 including a routing structure, wherein the volatile configuration memory is further operable to store configuration data for the routing structure.

9. The programmable logic device of claim 1 including a plurality of programmable logic blocks, wherein the volatile configuration memory is further operable to store configuration data for the programmable logic blocks.

10. The programmable logic device of claim 1 wherein the non-volatile configuration memory includes at least one charge pump operable to cease operation in response to assertion of the power-down signal.

11. The programmable logic device of claim 1 including a phase-locked loop (PLL) regulator operable to provide a regulated voltage to at least one PLL, the PLL regulator further operable to cease operation in response to assertion of the power-down signal.

12. The programmable logic device of claim 1 including an I/O reference circuit operable to provide at least one I/O reference to the plurality of I/O circuits, the I/O reference circuit further operable to cease operation in response to assertion of the power-down signal.

13. The programmable logic device of claim 1 including a power-down input pad operable to receive the power-down signal from an external source.

14. The programmable logic device of claim 1 wherein the non-volatile configuration memory is flash memory.

15. A programmable logic device, comprising:

volatile configuration memory operable to store configuration data for configuring the programmable logic device;

means responsive to a power-down signal for supplying power to the volatile configuration memory if a power-down signal is de-asserted and to not supply power to the volatile configuration memory if the power-down signal is asserted; and non-volatile configuration memory operable to store configuration data for the volatile configuration memory and to transfer the configuration data to the volatile configuration memory after an asserted power-down signal is de-asserted.

16. A programmable logic device, comprising:

a logic core;

a power-down input pad operable to receive a power-down signal, the power-down signal having an asserted state and a de-asserted state;

a switch responsive to a power-down signal and operable to supply power to the logic core if a power-down signal is de-asserted and to not supply power to the logic core if the power-down signal is asserted; and an input buffer coupled between the power-down input pad and the switch for buffering the power-down signal, the input buffer operable to receive power from an external power supply regardless of the state of the power-down signal.

17. The programmable logic device of claim 16 wherein the logic core comprises a plurality of programmable logic blocks, an associated routing structure, and volatile configuration memory.

18. The programmable logic device of claim 16 wherein the switch comprises an internal power supply.

19. The programmable logic device of claim 18 including a band gap reference operable to provide a band gap reference voltage to the internal power supply, wherein the band gap reference is further operable to cease operation in response to assertion of the power-down signal.

20. The programmable logic device of claim 18 wherein the internal power supply includes a first transistor in a source-follower configuration operable to control a current drawn by a plurality of programmable logic blocks within the logic core.

* * * * *